United States Patent
Fujii et al.

(10) Patent No.: US 7,679,880 B2
(45) Date of Patent: Mar. 16, 2010

(54) ELECTROSTATIC CHUCK AND MANUFACTURING METHOD THEREOF

(75) Inventors: Hideki Fujii, Gunma-ken (JP); Waichi Yamamura, Gunma-ken (JP)

(73) Assignee: Shin-Etsu Chemical Co., Ltd, Tokyo (JP)

( * ) Notice: Subject to any disclaimer, the term of this patent is extended or adjusted under 35 U.S.C. 154(b) by 408 days.

(21) Appl. No.: 11/685,793

(22) Filed: Mar. 14, 2007

(65) Prior Publication Data
US 2007/0253138 A1  Nov. 1, 2007

(30) Foreign Application Priority Data
Apr. 28, 2006 (JP) ............... 2006-125484

(51) Int. Cl.
*H01L 21/683* (2006.01)
*H01T 23/00* (2006.01)
(52) U.S. Cl. ..................................... 361/234
(58) Field of Classification Search ............. 361/234
See application file for complete search history.

(56) References Cited

U.S. PATENT DOCUMENTS 5,880,922 A * 3/1999 Husain ................ 361/234
6,268,994 B1 * 7/2001 Logan et al. ............... 361/234

FOREIGN PATENT DOCUMENTS

| JP | 52067353 | 6/1977 |
|----|----------|--------|
| JP | 04358074 | 12/1992 |
| JP | 05109876 | 4/1993 |
| JP | 05129210 | 5/1993 |
| JP | 07010665 | 1/1995 |
| JP | 09040481 | 2/1997 |

* cited by examiner

*Primary Examiner*—Fritz M. Fleming
*Assistant Examiner*—Lucy Thomas
(74) *Attorney, Agent, or Firm*—Lowe Hauptman Ham & Berner, LLP

(57) ABSTRACT

The invention provides an electrostatic chuck in which a workpiece-chucking surface is made flat. An electrostatic chuck with a built-in electric heating means comprises a base plate formed of carbon or a carbon-based composite material and, successively formed on one surface of the base plate, an insulating layer (a1), an electroconductive layer (a2) to serve as a chucking electrode and an dielectric layer (a3) to form a workpiece-chucking surface and, successively formed on the other surface of the base plate, an insulating layer (b1) and an electroconductive layer (b2) to serve as an electric heater element, the electrostatic chuck improved in that the workpiece-chucking surface of the electrostatic chuck and an opposite surface thereof are warped to have a relationship selected from concavo-convex and convexo-concave, and in that the warping of the surfaces is in a manner such that the workpiece-chucking surface of the dielectric layer is rendered flat when the opposite surface of the electrostatic chuck is fastened to a machine.

5 Claims, 2 Drawing Sheets

ELECTROSTATIC CHUCK AND MANUFACTURING METHOD THEREOF

BACKGROUND OF THE INVENTION

1. Field of the Invention

The present invention relates to an electrostatic chuck for heating a semiconductor wafer as an object to be heated, and used in an apparatus such as a CVD apparatus and a sputtering apparatus in a manufacturing process of semiconductor devices, or an etching apparatus for etching a formed thin film.

2. Description of the Background Art

There exist various well-known technologies in the manufacture of devices for semiconductors, for instance technologies that involve forming polysilicon films and/or oxide films, conductive films, dielectric films and the like on a semiconductor wafer, using a CVD apparatus and/or a sputtering apparatus, or, conversely, technologies involving etching of the foregoing thin films using an etching apparatus. In order to ensure film formation and/or film etching quality in the above apparatuses it is necessary to keep the semiconductor wafer, as the objective work for heating, at a desired constant temperature, and hence a heater for heating the semiconductor wafer is required to perform such temperature control.

In semiconductor wafer heating are used electrostatic adsorption apparatuses for fixing the semiconductor wafer onto the heater, in a reduced-pressure atmosphere. The material of the electrostatic chucking apparatus shifts from resins to ceramics as the temperature of the process increases (Japanese Patent Application Laid-open No. S52-67353).

Wafer heaters having electrostatic chucking functionality have also been proposed recently. These wafer heaters combine a monolithic-type ceramic wafer heater with an electrostatic chucking apparatus. For instance, an electrostatic chuck using $TiO_2$-containing alumina in an insulating layer of an electrostatic chucking apparatus is employed in low-temperature stages, as during etching (Toshiya WATANABE "Electrostatic Force Characteristics of Ceramic Electrostatic Chucks", NEW CERAMICS (1994) No. 2, p. 49-53, 1994), while an electrostatic chuck using pyrolytic boron nitride in an insulating layer of an electrostatic chucking apparatus is employed in high-temperature stages, as during CVD (Japanese Patent Application Laid-open Nos. H04-358074, H05-109876, H05-129210, and H07-10665).

As the ceramic substrate is usually used a sintered body obtained through sintering of a starting-material powder to which a sintering auxiliary agent is added. Such a ceramic substrate undergoes strain as a result of thermal stress caused by the differences in the coefficient of thermal expansion among different materials such as a heat-generating material and the like. When, for instance, a semiconductor wafer or the like is placed upon, and heated by, a substrate of an electrostatic chuck with a built-in electric heating means comprising different materials such as a ceramic substrate, a heat-generating material or the like, the above-described strain can lead to deficient surface matching with the wafer, thereby disrupting temperature distribution.

Known methods for suppressing such strain include methods in which the rigidity of the ceramic substrate is enhanced by increasing the thickness thereof, and in which affixing of the substrate to a mount is reinforced. The attempt to suppress strain that way, however, is problematic in that thermal stress accumulates inside the ceramic substrate and in the interfacial boundary between the ceramic substrate and the heat-generating material, so that, upon repeated rising and falling temperature cycles, ruptures occur in the boundary between sintered particles and/or in the boundary between the ceramic substrate and the heat-generating material. A thicker ceramic substrate means a greater heat capacity, which is problematic in that more time is required as a result for raising and lowering the temperature.

In order to solve these problems, integration-type resistance-heating multilayer electrostatic chucks with built-in electric heating means have been developed in which an insulating layer comprising pyrolytic boron nitride is formed by thermochemical vapor-phase deposition (thermal CVD) on a base plate comprising carbon or a carbon-based composite material, onto the insulating layer being further bonded a heater pattern comprising a pyrolytic graphite film formed by thermal CVD, the heater pattern being covered by a compact layer-like protective film of pyrolytic boron nitride or the like (Japanese Patent Application Laid-open No. H09-40481).

Such integrated-type resistance-heating multilayer electrostatic chucks with built-in electric heating means are highly pure and chemically stable, and are also strong towards thermal shock, for which reason they are used in a wide range of fields where abrupt temperature changes are required. More specifically, such chucks are widely used in the field of semiconductor wafer manufacture, for instance, where the semiconductor wafers or the like are subjected, wafer by wafer, to a continuous process that involves gradual temperature changes. Such multilayer electrostatic chucks with built-in electric heating means are widely used because they are manufactured by CVD throughout, as described above, and have hence no grain boundaries, are free of degassing, and exert no negative influence during processes that involve heating in vacuum.

These multilayer electrostatic chucks with a built-in electric heating means have a layer structure of various materials, and comprise for instance a support substrate, an electrode layer, wiring, a dielectric layer, and an electroconductive layer. Warping is likely to occur in any stage owing to processing strain. When a wafer or the like in this warped state is fastened to another surface and is heated there occur problems such as impaired matching between surfaces and uneven temperature distribution.

Conventional technologies have resorted to flattening the workpiece-chucking surface through mechanical processing, to achieve a uniform attracting force in order to eliminate such warping. However, just flattening the workpiece-chucking surface alone leads eventually to a less flat workpiece-chucking surface, and hence in a lower attracting force, owing to the resulting in-plane film thickness distribution and the influence of warping of the opposite side when the electrostatic chuck is fixed on an apparatus to be mounted thereon.

In the case of dielectric layers having high volume resistivity values, in particular, such attracting force is dominated by Coulomb forces, and increases in proportion to the square root of the thickness of the dielectric layer. That is, the thickness distribution of the workpiece-chucking surface is an extremely important factor bearing directly on the in-plane attracting force distribution, with a larger film thickness distribution resulting in a greater variation of in-plane attracting force, which ultimately gives rise to temperature distribution unevenness in the heated body.

When attempting to achieve a uniform film thickness distribution in order to increase the attracting force, the workpiece-chucking surface adopts a concave or a convex shape, which in turn gives also rise to temperature distribution unevenness in the heater body. When the workpiece-chucking surface is concave/convex, moreover, attracting speed and attracting strength vary in accordance with the concave/convex contour, being different in the central portion and the periphery of the heater body adsorbed to the workpiece-chucking surface. This gives rise to frictional forces between the heater body and the workpiece-chucking surface, from the center towards the periphery, and results in increased particle formation. Suppressing particle formation as much as possible is an extremely important issue when it comes to increasing semiconductor manufacturing yields.

SUMMARY OF THE INVENTION

The above calls thus for a technology that should afford a uniform in-plane distribution of the attracting force, enhanced in-plane temperature distribution of the heater body, and reduced particle generation. Therefore, it is an object of the present invention to provide an electrostatic chuck such that the workpiece-chucking surface becomes flattened when mounted on an apparatus such as a CVD apparatus or a sputtering apparatus in a manufacturing process of a semiconductor devices, or on an etching apparatus for etching a formed thin film.

In order to solve the above problems, the electrostatic chuck (electrostatic chuck with a built-in electric heating means) of the present invention is an electrostatic chuck with a built-in electric heating means comprising a base plate formed of carbon or a carbon-based composite material and, successively formed on one surface of the base plate, an insulating layer (a1), an electroconductive layer (a2) to serve as a chucking electrode and an dielectric layer (a3) to form a workpiece-chucking surface and, successively formed on the other surface of the base plate, an insulating layer (b1) and an electroconductive layer (b2) to serve as an electric heater element, the electrostatic chuck improved in that the workpiece-chucking surface of the electrostatic chuck and an opposite surface thereof are warped to have a relationship selected from concavo-convex and convexo-concave, and in that the warping of the surfaces is in a manner such that the workpiece-chucking surface of the dielectric layer is rendered flat when the opposite surface of the electrostatic chuck is fastened to a processing apparatus.

Preferably, the warping of the surfaces is such that, when height is measured in the direction of thickness of the electrostatic chuck, difference Hc between height of any point on periphery of the workpiece-chucking surface and height of center point of the workpiece-chucking surface does not exceed 100 μm, and difference Hh between the height of any point on periphery of the opposite surface and height of the middle point of the opposite surface does not exceed 100 μm, and difference between Hc and Hh does not exceed 10 μm at any point on periphery of the chuck. Also, the dielectric layer (a3) is preferably formed of a dielectric material selected from the group consisting of aluminum nitride, mixtures of aluminum nitride and boron nitride, pyrolytic boron nitride, pyrolytic boron nitride with addition of carbon and pyrolytic boron nitride with addition of carbon and silicon.

Furthermore, the manufacturing method of the electrostatic chuck of the present invention comprises the steps of machine-working of the surface of the dielectric layer so as to ensure uniform thickness of the layer; and machine working of the surface of the insulating layer in conformity with the surface of the dielectric layer so as to ensure that the surface of the dielectric layer is a completely flat plane when the electrostatic chuck is mounted and fixed onto an apparatus.

In the present invention, the workpiece-chucking surface of the electrostatic chuck and the opposite surface thereof are warped to have a relationship selected from concavo-convex and convexo-concave, while the workpiece-chucking surface is rendered flat when the opposite surface of the electrostatic chuck is fastened to a machine. This has the effect of increasing the temperature distribution of the heated body, and enables to provide an electrostatic chuck with a built-in electric heating means that can reduce the particles adhering to the heated body.

DESCRIPTION OF THE PREFERRED EMBODIMENTS

Flattening through mechanical processing departs from conventional approaches which, as described above, are likely to result in an unsatisfactory film thickness distribution and droop in peripheral portions. The present invention is based on the finding that causing the workpiece-chucking surface and the opposite surface thereof to be warped to have a relationship selected from concavo-convex and convexo-concave enables the workpiece-chucking surface to become completely flat when the electrostatic chuck is mounted on an apparatus.

The invention will be described in detail next with reference to the accompanying drawings.

Figure 1:
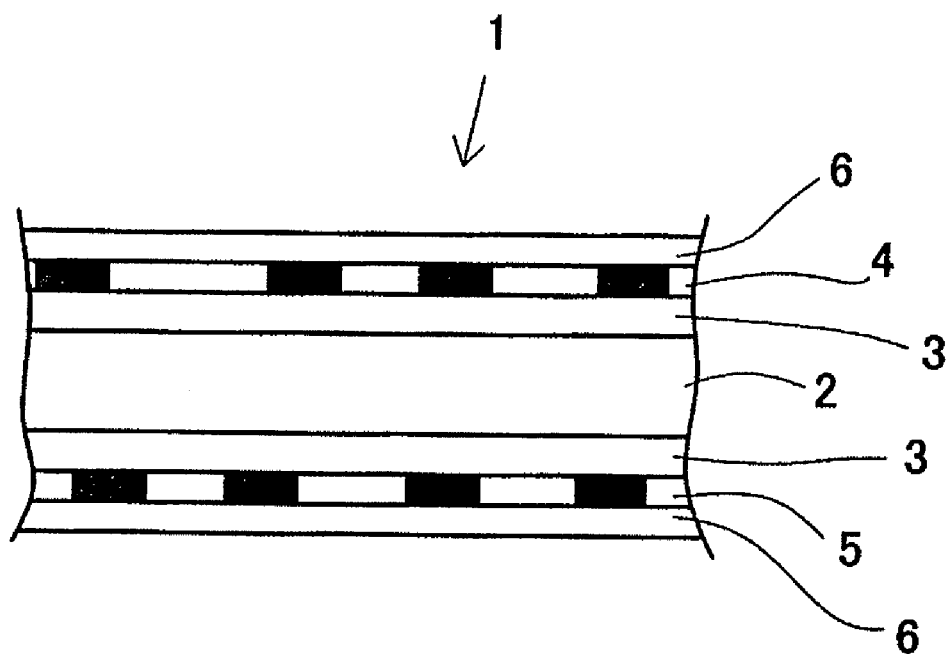
FIG. 1 is an explanatory diagram illustrating the layer constitution of the electrostatic chuck with a built-in electric heating means of the present invention.

FIG. 1 is an explanatory diagram illustrating the layer constitution of the electrostatic chuck with a built-in electric heating means of the present invention.

Figure 2:
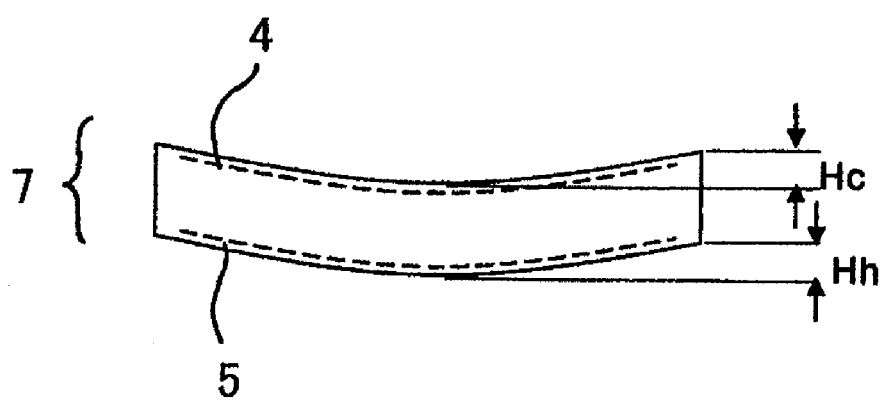
FIG. 2 is an explanatory diagram illustrating the electrostatic chuck with a built-in electric heating means of the present invention in a state with both faces polished.

FIG. 2 is an explanatory diagram illustrating the electrostatic chuck with a built-in electric heating means of the present invention in a state with both faces polished.

Figure 3:
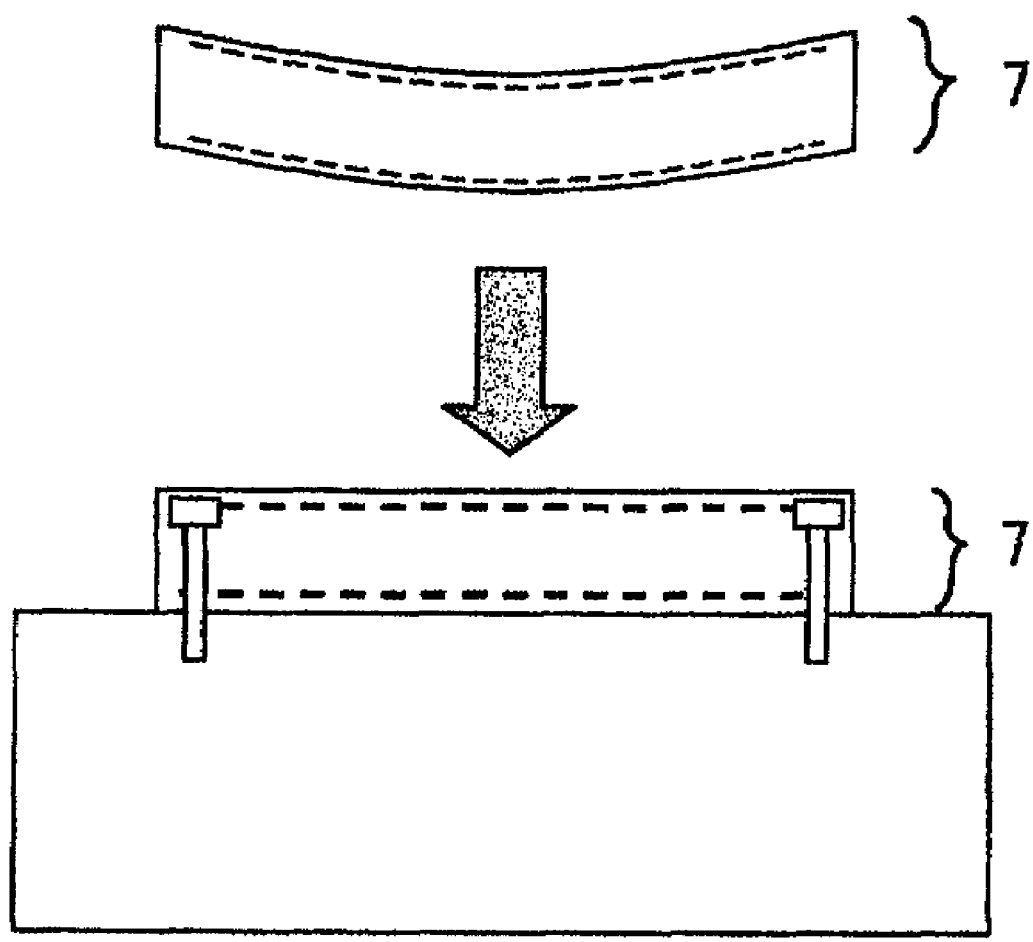
FIG. 3 is an explanatory diagram illustrating the electrostatic chuck with a built-in electric heating means of the present invention mounted on an apparatus.

FIG. 3 is an explanatory diagram illustrating the electrostatic chuck with a built-in electric heating means of the present invention mounted on an apparatus.

In FIG. 1, the reference numeral 1 denotes a base-shape of the electrostatic chuck with a built-in electric heating means prior to final shaping, the reference numeral 2 denotes a substrate or base plate, and the reference numeral 3 denotes an insulating layer formed on the surface of the substrate 2, the reference numerals 4 and 5 denote electroconductive layers formed on the insulating layer 3, with respective patterns formed thereon, the reference numeral 4 denoting an electroconductive layer forming an electrostatic chuck body, and the reference number 5 denoting electroconductive layer forming a resistance heating element. On each of the electroductive layers 4 and 5 is further provided a dielectric layer 6. The dielectric layer 6 on the electroconductive layer 5 may be omitted. The layer structure of this electrostatic chuck with a built-in electric heating means is basically identical with a conventional one.

The substrate 2 is formed of carbon or a carbon-based composite material, such as amorphous graphite, carbon-fiber reinforced carbon or the like.

As the first insulating layer 3 may be used pyrolytic boron nitride.

As the electroconductive layers 4, 5 are preferably used pyrolytic graphite or pyrolytic graphite to which boron is added.

The dielectric layer 6 is formed preferably of aluminum nitride, mixtures of aluminum nitride and boron nitride, pyrolytic boron nitride, pyrolytic boron nitride with addition of carbon and pyrolytic boron nitride with addition of carbon and silicon.

The base-shape of the electrostatic chuck with a built-in electric heating means 1 prior to final shaping is mechanically processed in order to acquire shape and surface characteristics, inter alia, so as to form the electrostatic chuck with a built-in electric heating means 7 illustrated in FIG. 2.

The electrostatic chuck with a built-in electric heating means 7 is machine-worked in such a way that the workpiece-chucking surface (the surface on the side of the electrostatic chuck body) on which the workpiece (wafer) is placed, and the opposite surface thereof (the surface on the side of the resistance heating element) are warped to have a relationship selected from concavo-convex and convexo-concave. It is not always necessary that one of the faces should be convex, but experience has proved that it is preferable that the workpiece-chucking surface should have a concave shape that is lowest at the center portion and rises towards the periphery thereof, while the other main surface should have a convex shape that is highest at the center portion and becomes lower towards the periphery thereof.

Any known machine tools can br used for working including lathes, fraises, milling machines, lapping machines and the like but bite grinding with a lathe is a preferred method.

If the warping is too heavy, the bending stress upon fastening to a machine becomes excessive, which might result in breakage of the substrate, and hence the degree of concavity and convexity is such that the perpendicular distance between the height of any point of periphery and the height of the centerl position of the surface does not exceed 100 µm, for both surfaces, and the difference between the respective absolute values of concavity and convexity does not exceed 10 µm.

With such a shape, the electrostatic chuck with a built-in electric heating means itself becomes warped. To be fixed to an apparatus, however, the electrostatic chuck is fixed by being tightened on several positions. Thereupon, as illustrated in FIG. 3, warp is attracted and the workpiece-chucking surface acquires as a result ideal flatness, thereby increasing attracting strength and achieving a reduction in particles. In FIG. 3, the reference numeral 8 denotes an apparatus such as a CVD apparatus, a sputtering apparatus, or an etching apparatus for etching a formed thin film, and the reference numeral 9 denotes a fastener.

The manufacturing method of the electrostatic chuck of the present invention comprises preferably machine-working of the surface of the dielectric layer so as to ensure uniform thickness of the layer; and machine working of the surface of the insulating layer in conformity with the surface of the dielectric layer so as to ensure that the surface of the dielectric layer is a completely flat plane when the electrostatic chuck is mounted and fixed onto a machine.

In order to achieve the above, the thickness of the workpiece-chucking surface is measured first, and then the workpiece-chucking surface is worked to have a uniform thickness. In a manufacturing method for forming a dielectric layer containing pyrolytic boron nitride produced by thermochemical vapor-phase deposition (thermo-CVD) the film is formed to a greater thickness on the center position of the substrate, whereby the amount of milling required in the center position increases. Hence, the workpiece-chucking surface after processing has a concave shape that is lowest at the center position and rises towards the periphery thereof. Next the opposite surface is mechanically worked in conformity with the above shape, so that the other main surface has a convex shape that is highest at the center position and becomes lower towards the periphery thereof, to achieve a uniform thickness of the workpiece-chucking surface and to achieve a flat workpiece-chucking surface upon fixing to a machine.

EXAMPLES

The present invention is described below in more detail by way of examples which, however never limit the scope of the invention in any way.

Example 1

A graphite substrate having a diameter of 200 mm and a thickness of 15 mm was made to react with a gas containing ammonia and boron trichloride at 1800° C. under 100 Torr, to form a protective layer of pyrolytic boron nitride on the substrate. Next, methane gas was pyrolyzed thereon at 2200° C. under 5 Torr, to form a layer of pyrolytic graphite of 100 µm thickness. The front surface of this pyrolytic graphite layer was worked through electrode patterning into an electrode for electrostatic attraction, while the opposite side was processed to a heater pattern to yield a heat-generating layer. On both these faces were then formed 200 µm-thick protective layers comprising pyrolytic boron nitride through reaction with a mixed gas of ammonia and boron trichloride at 2000° C. under 5 Torr.

The workpiece-chucking surface and the heat-generating layer were worked next so as to yield a workpiece-chucking surface having a uniform film thickness. An electrostatic chuck with a built-in electric heating means having electrostatic attracting function was prepared thus in such a way that, with the shape factors given in Table 1, the workpiece-chucking surface is rendered substantially flat when the electrostatic chuck with a built-in electric heating means was fixed to an apparatus.

The heater was heated at 300° C. and was applied a voltage of ±2000 V, then thereto was attracted a silicon wafer having an embedded thermocouple for temperature monitoring. A measurement of the in-plane temperature distribution after 1 minute of voltage being applied yielded a temperature distribution ΔT of 4° C., showing good attracting forces.

The shape factors of the heater and the temperature distribution on the wafer are shown in Table 1.

Example 2

An electrostatic chuck with a built-in electric heating means having electrostatic attracting functionality was manufactured in the same manner as in Example 1, except that, upon forming the insulating layer of the uppermost layer, herein was formed an insulating layer comprising 200 µm-thick pyrolytic boron nitride having an electric resistivity of $10^{11}$ Ω·cm, containing 1% by mass of carbon, by reacting with a mixed gas of ammonia, boron trichloride and methane.

The temperature distribution of the wafer ΔT at 500° C. by this heater was of 4° C., indicative of good attracting strength.

The shape factors of the heater and the temperature distribution on the wafer are given in Table 1.

Comparative Example 1

An electrostatic chuck with a built-in electric heating means having electrostatic attracting functionality was manufactured in the same manner as in Example 1, except that herein the insulating layer of the uppermost layer was processed so as to yield a workpiece-chucking surface having a flat shape, while the heat-generating surface was not worked.

The temperature distribution on the wafer ΔT at 300° C. by this heater was as large as 15° C.

The shape of the heater and the temperature distribution of the wafer are given in Table 1.

Comparative Example 2

An electrostatic chuck with a built-in electric heating means having electrostatic attracting functionality was manufactured in the same manner as in Example 2, except that herein the insulating layer of the uppermost layer was worked so as to yield a workpiece-chucking surface having full flatness.

The temperature distribution on the wafer ΔT at 500° C. by this heater was as large as 12° C.

The shape factors of the heater and the temperature distribution on the wafer are shown in Table 1.

TABLE 1

Heater shape and wafer temperature distribution in Examples 1 and 2 and Comparative Examples 1 and 2

|  | Example 1 | Example 2 | Comparative Example 1 | Comparative Example 2 |
|---|---|---|---|---|
| Height difference of chucking surface (Hc) | 5 μm | 6 μm | 2 μm | 3 μm |
| Height difference of heating surface (Hh) | 4 μm | 8 μm | 20 μm | 15 μm |
| Warping of substrate (Hc − Hh) | 1 μm | −2 μm | 18 μm | 12 μm |
| Temperature distribution of water (ΔT, ° C.) | 4° C. | 5° C. | 15° C. | 12° C. |

Example 3

A graphite substrate having a diameter of 300 mm and a thickness of 15 mm was made to react with a gaseous mixture containing ammonia and boron trichloride at 1800° C. under 100 Torr, to form a protective layer of pyrolytic boron nitride on the substrate. Next, methane gas was pyrolyzed thereon at 2200° C. and 5 Torr, to form a layer of pyrolytic graphite of 100 μm thickness. The front surface of this pyrolytic graphite layer was worked through electrode patterning into an electrode for electrostatic attraction, while the opposite side was worked to a heater pattern to yield a heat-generating layer. On both of these faces were then formed 200 μm-thick protective layers comprising pyrolytic boron nitride through reaction with a mixed gas of ammonia and boron trichloride at 2000° C. under 5 Torr.

The workpiece-chucking surface and the heat-generating layer were processed next so as to yield a workpiece-chucking surface having a uniform film thickness. An electrostatic chuck with a built-in electric heating means having electrostatic attracting functionality was manufactured thus in such a way that, with the shapes given in Table 2, the workpiece-chucking surface is rendered substantially flat when the electrostatic chuck with a built-in electric heating means was fastened to an apparatus.

The heater was heated at 300° C., to which was applied a voltage of ±2000 V, then thereto was kept attracted a silicon wafer over 3 minutes. The particle count of the chucking surface of the wafer was measured after releasing from the heater. The deposited particle count was extremely small, with a total particle count of 52.

The heater shape factors and the particle count are shown in Table 2.

Comparative Example 3

A ceramic heater having electrostatic attracting functionality was manufactured in the same way as in Example 2, except that herein the insulating layer of the uppermost layer was worked so as to yield a workpiece-chucking surface having a flat shape, then a wafer was held attracted to the ceramic heater.

The particle count of the chucking surface of the wafer was measured after releasing from the heater. The deposited particle count observed was extremely high, with a total particle count of as large as 2005.

The heater shape factors and the particle count are shown in Table 2.

TABLE 2

Heater shape and wafer particle count in Example 3 and Comparative Example 3

|  | Example 3 | Comparative Example 3 |
|---|---|---|
| Height difference of chucking surface (Hc) | 4 μm | 2 μm |
| Height difference of heating surface (Hh) | 8 μm | 12 μm |
| Warping of substrate (Hc − Hh) | 4 μm | 16 μm |
| Overall particles counted | 52 | 2005 |

The present invention affords an increased smoothness in a sample workpiece-chucking surface of the electrostatic chuck with a built-in electric heating means. The sample indicates that high-precision processing can be carried out, which makes therefore a substantial contribution to, inter alia, the technical field of semiconductor device manufacturing.

What is claimed is:

1. An electrostatic chuck (1) with a built-in electric heating means comprising a base plate (2) formed of carbon or a carbon-based composite material and, successively formed on one surface of the base plate (2), an insulating layer (3) an electroconductive layer (4) to serve as a chucking electrode and a dielectric layer ((6)) to form a workpiece-chucking surface and, successively formed on the other surface of the base plate (2), an insulating layer (3) and an electroconductive layer (5) to serve as an electric heater element, said electrostatic chuck being improved in that said workpiece-chucking surface of the electrostatic chuck and an opposite surface thereto are warped to have a relationship selected from concavo-convex and convexo-concave, and in that the warping of said surfaces is in a manner such that the workpiece-chucking surface of the dielectric layer is rendered flat when said opposite surface of the electrostatic chuck is fixed flat to an apparatus without a help of heat.

2. The electrostatic chuck according to claim 1, having an insulating layer (6) on said heater element electroconductive layer (5).

3. The electrostatic chuck according to claim 1, wherein the warping of said surfaces is such that, when height is measured in the direction of thickness of the electrostatic chuck, difference Hc between height of any point on periphery of said workpiece-chucking surface and height of central point of said workpiece-chucking surface does not exceed 100 μm, and difference Hh between the height of any point on periphery of said opposite surface and height of central point of said opposite surface does not exceed 100 μm, and difference between Hc and Hh does not exceed 10 μm at any point on periphery of the chuck.

4. The electrostatic chuck according to claim 1 which is further characterized in that the dielectric layer (6) is formed of a dielectric material selected from the group consisting of aluminum nitride, mixtures of aluminum nitride and boron nitride, pyrolytic boron nitride, pyrolytic boron nitride with addition of carbon and pyrolytic boron nitride with addition of carbon and silicon.

5. A method for the preparation of the electrostatic chuck according to claim 2 which comprises the steps of:
  machine working of the surface of the dielectric layer (6) so as to ensure uniform thickness of the layer; and
  machine working of the surface of the insulating layer (6) in conformity with the surface of the dielectric layer (6) so as to ensure that the surface of the dielectric layer (6) is a completely flat plane when the electrostatic chuck is fixed to an apparatus.

* * * * *